(12) United States Patent
Taenaka et al.

(10) Patent No.: US 6,649,274 B1
(45) Date of Patent: Nov. 18, 2003

(54) ELECTROLYTIC COPPER FOIL WITH CARRIER FOIL AND COPPER-CLAD LAMINATE USING THE ELECTROLYTIC COPPER FOIL WITH CARRIER FOIL

(75) Inventors: Sakiko Taenaka, Ageo (JP); Makoto Dobashi, Ageo (JP); Akiko Sugimoto, Ageo (JP); Naotomi Takahashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 45 days.

(21) Appl. No.: 10/031,280

(22) PCT Filed: Sep. 29, 2000

(86) PCT No.: PCT/JP00/06765
§ 371 (c)(1),
(2), (4) Date: Nov. 7, 2001

(87) PCT Pub. No.: WO01/34879
PCT Pub. Date: May 17, 2001

(30) Foreign Application Priority Data

Nov. 11, 1999 (JP) .......................................... 11-321687

(51) Int. Cl.$^7$ ............................................. B32B 15/08
(52) U.S. Cl. ...................................... 428/457; 428/458
(58) Field of Search .................................. 428/457, 458

(56) References Cited

U.S. PATENT DOCUMENTS 4,937,133 A * 6/1990 Watanabe et al. ............ 428/209
5,153,050 A * 10/1992 Johnston ..................... 428/209

FOREIGN PATENT DOCUMENTS

JP          8-197681       * 8/1996

* cited by examiner

Primary Examiner—Monique R. Jackson
(74) Attorney, Agent, or Firm—Jenkens & Gilchrist

(57) ABSTRACT

An object of the present invention is to reduce and to stabilize peel strength of a carrier foil in an electrodeposited copper foil with carrier employing an organic adhesive interface, thereby facilitating peeling of the carrier foil. The electrodeposited copper foil with carrier of the present invention contains a carrier foil layer, an organic adhesive interface layer formed on the carrier foil layer, and an electrodeposited copper foil layer formed on the organic adhesive interface layer, wherein the difference between the coefficient of thermal expansion of material forming the carrier foil layer at a certain temperature and that of material forming the electrodeposited copper foil at the same temperature is $4 \times 10^{-7}$/deg.C or more.

2 Claims, 2 Drawing Sheets

ELECTROLYTIC COPPER FOIL WITH CARRIER FOIL AND COPPER-CLAD LAMINATE USING THE ELECTROLYTIC COPPER FOIL WITH CARRIER FOIL

TECHNICAL FIELD

The present invention relates to electrodeposited copper foil with carrier predominantly employed for producing printed wiring boards.

BACKGROUND ART

Conventionally, electrodeposited copper foil with carrier has been employed as a material for producing printed wiring boards, which are widely used in the electric and electronic industries. In general, electrodeposited copper foil with carrier is bonded, through hot-pressing, onto an electrically insulating polymer material substrate such as glass-epoxy substrate, phenolic polymer substrate, or polyimide, to thereby form a copper-clad laminate, and the thus-prepared laminate is used for producing printed wiring boards of high density mounting.

In hot-pressing, a copper foil, a prepreg (substrate) which is cured into a B-stage, and mirror plates serving as spacers are laid-up in a multilayered manner, and the copper foil and the prepreg are hot-press-bonded at high temperature and pressure (hereinafter the step may be referred to as "press-forming"). When wrinkles are in turn generated in the copper foil to be pressed, cracks are generated in the wrinkled portions, thereby possibly causing bleeding of resin from a prepreg, or open circuit of a formed electric circuit during an etching step followed in production steps of printed wiring boards. In an electrodeposited copper foil with carrier, the carrier foil prevents generation of wrinkles in the electrodeposited copper foil.

Electrodeposited copper foils with carrier are generally divided into two types; i.e., foils with peelable carriers and foils with etchable carriers. Briefly, the difference between the two types of foils lies in the method for removing the carrier after completion of press-forming. In foil with peelable carrier, the carrier is removed by peeling, whereas in foil with etchable carrier, the carrier is removed by etching. The present invention is directed to electrodeposited copper foil with peelable carrier.

However, the peel strength of conventional peelable carriers after completion of press-forming varies considerably, and a preferable strength of 50–300 gf/cm is generally required. In some cases, a carrier foil cannot be removed from the copper foil. Thus, conventional peelable carriers have a drawback; i.e., target peel strength is difficult to attain. The drawback prevents the widespread use of the electrodeposited copper foil with carrier employed for general use.

Causes of variation in peel strength of a carrier foil will next be described. Conventional electrodeposited copper foil with carrier, regardless of whether the carrier is peelable or etchable, has a metallic—e.g., zinc-containing—adhesive interface layer between the carrier foil and the electrodeposited copper foil. The amount of metal components forming the adhesive interface layer determines, with slight dependence on the type of the carrier foil, whether the formed copper foil with carrier has peelable carrier foil or etchable carrier foil.

In many cases, such a metallic adhesive interface layer is formed electrochemically; i.e., through electrodeposition by use of a solution containing a predetermined metallic element. However, in electrodeposition, controlling the amount of deposition on a very minute scale is difficult, and reproduction of the deposition is unsatisfactory as compared with other methods for forming the adhesive interface layer. In addition, the boundary line of the required deposition amount determining whether the formed carrier becomes peelable or etchable is difficult to adjust; i.e., small variations in amount of a metallic component contained in the adhesive interface layer determine the type of the carrier. Thus, stable peeling performance may be difficult to attain.

From another point of view, such a carrier foil is removed by peeling after completion of press-forming, typically at a temperature as high as 180° C. under high pressure for 1 to 3 hours. Components contained in the carrier foil and copper atoms contained in the electrodeposited copper foil may be mutually diffused through the adhesive interface layer. Such mutual diffusion strengthens the adhesion, thereby failing to attain moderate peel strength.

In order to solve the aforementioned drawbacks, the present inventors have proposed electrodeposited copper foil with carrier in which the adhesive interface layer between the carrier foil layer and the electrodeposited copper foil comprises an organic agent such as CBTA, and a method for producing the electrodeposited copper foil with carrier.

The aforementioned electrodeposited copper foil with carrier which the present inventors have proposed completely solves the drawback that the carrier foil cannot be peeled; i.e., the proposed foil can be peeled at a strength of 3–200 gf/cm. However, there has been still increasing demand for a copper foil which can be peeled with a moderate and constant peel strength after a copper-clad laminate is produced by use of an electrodeposited copper foil with carrier.

Meanwhile, an advantage of electrodeposited copper foil with carrier per se is the state where one surface of the carrier foil are placed as if it were bonded in a lamination manner to one surface of an electrodeposited copper layer. In other words, the electrodeposited copper foil with carrier can prevent staining the surface of the electrodeposited copper foil with foreign matter and damaging the electrodeposited copper foil layer by maintaining the bonding state at least immediately before an etching step for forming printed circuits, which step is carried out after production of a copper-clad laminate through hot-pressing the electrodeposited copper foil with carrier and a prepreg (substrate).

Thus, separation of a carrier foil and an electrodeposited copper foil during handling of the electrodeposited copper foil with carrier before hot-press-forming is not acceptable. Although the carrier foil must be peeled with a moderate peel strength after completion of hot-pressing, lamination-type bonding of the carrier foil to one surface of an electrodeposited copper foil of a copper-clad laminate must also be maintained, at least immediately before an etching step so as to prevent contamination and staining the surface of the copper clad laminate with foreign matter.

SUMMARY OF THE INVENTION

In view of the foregoing, the present inventors have conducted extensive studies, and have concluded that the peel strength between a carrier foil and an electrodeposited copper foil should be controlled to 3 gf/cm to 100 gf/cm so as to maintain lamination-type bonding of the carrier to one surface of the electrodeposited copper foil at least immediately before an etching step with lower peel strength.

Thus, the aforementioned demands can be satisfied by selecting combination of materials of a carrier foil and an electrodeposited copper foil, which materials are predominant materials for forming an electrodeposited copper foil with carrier. This approach differs from the approach of modifying an organic agent which is employed in an adhesive interface layer and the approach of improving interface-forming techniques, such as a method for forming the adhesive interface layer. Since an electrodeposited copper foil with carrier is hot-pressed during production of a copper-clad laminate, the copper foil with carrier is subjected to a certain amount of thermal stress. The present inventors have found that, among properties of the materials, coefficient of thermal expansion is an important factor. The present invention has been accomplished on the basis of this finding.

Accordingly, the present invention provides an electrodeposited copper foil with carrier comprising a carrier foil layer, an organic adhesive interface layer formed on the carrier foil layer, and an electrodeposited copper foil layer formed on the organic adhesive interface layer, wherein the difference between the coefficient of thermal expansion of material forming the carrier foil layer at a certain temperature and that of material forming the electrodeposited copper foil at the same temperature is $4 \times 10^{-7}$/deg.C or more.

After careful studies, the present inventors have found that a carrier foil of the electrodeposited copper foil with peelable carrier employed for producing copper-clad laminates can be peeled considerably easily when the difference between the coefficient of thermal expansion of material forming the carrier foil layer at a certain temperature and that of material forming the electrodeposited copper foil at the same temperature is $4 \times 10^{-7}$/deg.C or more. Thus, the invention is based on this finding. When the carrier foil layer and the electrodeposited copper foil layer are subjected to heat hysteresis and the two layers exhibit identical thermal expansion behavior, the bonding conditions between the two layers via the organic adhesive interface layer are maintained within an elastic limit. Under such conditions, peeling at the organic adhesive interface layer is not promoted. However, when the difference between the coefficient of thermal expansion of material forming the carrier foil layer at a certain temperature and that of material forming the electrodeposited copper foil at the same temperature is $4 \times 10^{-7}$/deg.C or more, thermal stress for causing shear of the two layers at the organic adhesive interface is generated by heat hysteresis, which typically occurs during a process for producing copper-clad laminates. Thus, the two layers can be peeled from each other much more easily. When the difference between the coefficient of thermal expansion of material forming the carrier foil layer at a certain temperature and that of material forming the electrodeposited copper foil at the same temperature is controlled to $4 \times 10^{-7}$/deg.C or more, the peel strength can be controlled to 3–100 gf/cm, which is a target peel strength in the present invention. The difference, i.e., $4 \times 10^{-7}$/deg.C or more, may be applied in either case of expansion or shrinkage of the carrier foil with respect to the electrodeposited copper foil.

In the present invention, the range "$4 \times 10^{-7}$/deg.C or more" does not refer to a range in which the upper limit remains uncertain. This is because, given a material forming the carrier foil layer and a temperature at which the foil is treated, a specific upper limit of the difference between a coefficient of thermal expansion of material forming the carrier foil layer and that of material forming the electrodeposited copper foil is univocally determined.

In the electrodeposited copper foil with carrier of the invention, an organic adhesive interface layer is formed on a carrier foil layer and an electrodeposited copper foil layer is formed on the organic adhesive layer. Accordingly, the organic agent adheres to both the carrier foil layer and the electrodeposited copper foil layer, and the layer containing the organic layer also serves as an adhesive interface layer. When an appropriate organic agent is employed in the adhesive interface disposed between the carrier foil layer and the electrodeposited copper foil layer, peeling behavior of the carrier foil layer and the electrodeposited copper layer caused by difference in coefficient of thermal expansion is relaxed, even though the electrodeposited copper foil with carrier is subjected to certain thermal impact during a process for producing copper-clad laminates. Accordingly, spontaneous peeling of the carrier foil layer and the electrodeposited copper layer is considered to be prevented.

In the present invention, the electrodeposited copper foil with carrier has a schematic cross-sectional structure as shown in FIG. 1. Specifically, one surface of the carrier foil layer (hereinafter may be simply referred to as "carrier foil") is placed as if it were boned in a laminated manner to one surface of the electrodeposited copper layer (hereinafter may be simply referred to as "electrodeposited copper foil") via the organic adhesive interface layer. Typically, such as electrodeposited copper foil with carrier and a prepreg (e.g., FR-4 substrate) or an internal printed wiring board—the prepreg and the internal printed wiring board serving as insulating layers—are laminated, and the resultant laminate is press-formed in an atmosphere at approximately 180° C., to thereby obtain a copper-clad laminate.

In the present invention, either organic material or inorganic metallic material may be used to form the carrier foil which is combined with an electrodeposited copper foil, so long as the difference in coefficient of thermal expansion is $4 \times 10^{-7}$/deg.C or more. However, as described in the invention, an electrodeposited copper foil is advantageously employed, in view of ease of recycling the foil and stable production thereof. In this case, although the electrodeposited copper foil and the carrier foil of the electrodeposited copper foil with carrier of the present invention are both electrodeposited copper foils, copper foils having different physical properties, particularly coefficient of thermal expansion, must be combined.

In order to provide better understanding of the following description, types of electrodeposited copper foils will next be described. Although there are a variety of international standards regarding the classification of electrodeposited copper foils, classification on the basis of the most widely employed standards; i.e., IPC (The Institute for Interconnecting and Packaging Electronic Circuits) standards, will be described.

According to the IPC standards, electrodeposited copper foils are classified as Grade 1 to Grade 3 on the basis of basic physical properties such as elongation and tensile strength. Copper foil designated by Grade 1 is standard electrodeposited copper foil, and copper foil designated by Grade 2 is high ductility electrodeposited copper foil. These days, among persons having ordinary skill in the art, electrodeposited copper foils belonging to Grades 1 and 2 are generally called standard electrodeposited copper foils (hereinafter these copper foils are referred to as "standard electrodeposited copper foils"). Electrodeposited copper foil belonging to Grade 3 is generally called HTE foil. HTE foil generally refers to copper foil exhibiting high temperature elongation of 3% in an atmosphere at 180° C. HTE foil is completely different from standard copper foils belonging to Grades 1 and 2, since the standard copper foils exhibit a high temperature elongation less than 2%.

In recent manufacture of printed wiring board, copper foils belonging to Grade 3 are further classified clearly into two categories; i.e., electrodeposited copper foils exhibiting a high temperature elongation of approximately 3% to 18% (hereinafter simply referred to as HTE foils) and electrodeposited copper foils exhibiting a high temperature elongation of approximately 18% to 50% (throughout the present description, these foils are simply referred to as S-HTE foils). These two types of foils are employed in accordance with purposes of use.

The basic difference between HTE foil and S-HTE foil lies in characteristics of deposited crystals, even though these two foils comprise electrodeposited copper having a purity of approximately 99.99%. During a process for producing copper-clad laminates, an electrodeposited copper foil is hot-pressed so as to be laminated with a substrate by heating at 180° C. for approximately 60 minutes. Through observation under an optical microscope of the metallographic structure of the foils after completion of heating, no recrystallization is observed in HTE foil, but recrystallization is observed in S-HTE foil.

The difference is considered to be due to production conditions of the foils. Briefly, production conditions during electrolysis, such as composition of a solution, concentration of a solution, a method for filtering a solution, solution temperature, additives, and current density, are modified in order to control physical properties of copper foils. This may cause variation in crystallographic properties of deposited crystals. Particularly, the more easily recrystallization occurs, the more dislocations are accumulated in crystals. The dislocations are immobilized tightly, and immediately undergo rearrangement by application of a small amount of heat, thereby possibly causing recrystallization readily.

The IPC standards also include classification of copper foils from another aspect; i.e., surface profile (roughness) of copper foil which is laminated with a substrate to produce copper-clad laminates. The classification is determined by surface roughness obtained in accordance with the IPC-TM-650 test method. Specifically, copper foils are categorized into three types: standard profile foil (S type) having no particular specified roughness; low profile foil (L type) having a maximum roughness of 10.2 $\mu$m or less; and very low profile foil (V type) having a maximum roughness of 5.1 $\mu$m or less.

Among them, when a copper foil belonging to V type, setting aside S type or L type, is produced by electrolysis, the amounts of impurities in an electrolytic solution must be lowered and conditions for electrolysis must be particularly tailored. The grain size of deposited crystals must be reduced to a considerably small size such that the grains cannot be observed under an optical microscope having a magnification of some 100 times, as compared with columnar deposits typically observed under an optical microscope. Thus, electrodeposited copper foil belonging to V type has very fine crystal grains, and such metallographic structure is completely different from that of other copper foils. The fine crystal grains provide high tensile strength and hardness.

The aforementioned difference in metallographic characteristic provides difference in physical properties of copper foil, and coefficient of thermal expansion varies to a small deg.C in accordance with the aforementioned types of copper foils. Therefore, when an electrodeposited copper foil endowed with appropriate physical properties; particularly, appropriate coefficient of thermal expansion, is employed as a carrier foil of electrodeposited copper foil with carrier, the coefficient of thermal expansion can be controlled to a value different from that of an electrodeposited copper foil of the electrodeposited copper foil with carrier.

In the present invention, the electrodeposited copper foil belonging to Grades 1 to 3 of the IPC standards and for forming the carrier foil layer refers to the aforementioned standard electrodeposited copper foil, HTE foil, and S-HTE foil. The material for forming the electrodeposited copper foil layer is a copper foil having very fine crystal grains and categorized into very low profile type (V type) of the IPC standards. Coefficient of thermal expansion ($\alpha$) of these copper foils were measured, and the results are shown in Table 1. In Table 2, absolute values of the difference between coefficient of thermal expansion ($\alpha$) of an electrodeposited copper foil layer and that ($\alpha$) of a carrier foil layer are summarized. Coefficient of thermal expansion was measured by means of a thermo-mechanical analyzer, TMA standard type CN8098F1 (product of Rigaku Denki).

TABLE 1

| | | Coefficient of thermal expansion ($\alpha$) × $10^{-5}$ | | | |
|---|---|---|---|---|---|
| Measuring | | Electrodeposited | Carrier foil layer | | |
| temperature ° C. | | Cu foil layer V type | HTE | S-HTE | Standard copper foil |
| Elevating | 50 | 1.355 | 0.969 | 1.395 | 1.453 |
| | 100 | 1.491 | 1.137 | 1.527 | 1.689 |
| | 150 | 1.601 | 1.411 | 1.649 | 1.860 |
| | 200 | 1.594 | 1.734 | 1.654 | 1.939 |
| Lowering | 150 | 1.649 | 1.757 | 1.595 | 2.264 |
| | 100 | 1.523 | 1.820 | 1.481 | 2.261 |
| | 50 | 1.515 | 2.240 | 1.477 | 4.637 |

TABLE 2

| | | Difference in coefficient of thermal expansion ($\alpha$) × $10^{-5}$ Absolute value of (electrodeposited Cu foil layer) – (carrier foil layer) | | |
|---|---|---|---|---|
| Measuring temperature ° C. | | (V type) – (HTE) | (V type) – (S-HTE) | (V type) – (standard Cu foil) |
| Elevating | 50 | 0.386 | 0.040 | 0.098 |
| | 100 | 0.354 | 0.036 | 0.198 |
| | 150 | 0.190 | 0.048 | 0.259 |
| | 200 | 0.140 | 0.060 | 0.345 |
| Lowering | 150 | 0.108 | 0.054 | 0.615 |
| | 100 | 0.297 | 0.042 | 0.738 |
| | 50 | 0.725 | 0.038 | 3.122 |

Calculated absolute values of ($\alpha$ of electrodeposited copper foil layer)–($\alpha$ of carrier foil) are shown in Table 2. When S-HTE foil is employed as a carrier foil, the average absolute value of the difference in coefficient of thermal expansion is $0.046 \times 10^{-5}$/deg.C in the temperature-elevating step and $0.049 \times 10^{-5}$/deg.C in the temperature-lowering step. When HTE foil is employed as a carrier foil, the average absolute value of the difference in coefficient of thermal expansion is $0.268 \times 10^{-5}$/deg.C in the temperature-elevating step and $0.318 \times 10^{-5}$/deg.C in the temperature-lowering step. When standard electrodeposited copper foil belonging to Grade 1 is employed as a carrier foil, the average absolute value of the difference in coefficient of thermal expansion is $0.225 \times 10^{-5}$/deg.C in the temperature-elevating step and $1.205 \times 10^{-5}$/deg.C in the temperature-lowering step.

When the carrier foil layer and the electrodeposited copper foil layer are subjected to heat hysteresis and the two layers exhibit identical thermal expansion behavior, the bonding conditions between the two layers via the organic adhesive interface layer are maintained within an elastic limit. Under such conditions, peeling at the organic adhesive interface layer is not promoted. Briefly, the greater the difference in coefficient of thermal expansion, the more easily peeling occurs due to thermal expansion, and the smaller the difference in coefficient of thermal expansion, the more difficult peeling is. In order to elucidate the relationship between coefficient of thermal expansion and peel strength, the data must be compared in the aforementioned temperature range. The difference in coefficient of thermal expansion must be $4 \times 10^{-7}$/deg.C or more. As is clear from Table 2, the difference in coefficient of thermal expansion is smaller in the temperature-elevating step than in the temperature-lowering step. Accordingly, whenever the coefficient of thermal expansion falls within the above range in the temperature-elevating step, it is considered to fall within the above range also in the temperature-lowering step.

From the test results of samples employing three types of carrier foils, carrier foil is considered to be easily peeled when HTE foil or standard electrodeposited copper foil is employed as the carrier foil. The reason for the low peel strength is that the difference between the coefficient of thermal expansion of V-type copper foil serving as the electrodeposited copper foil layer and that of carrier foil increases when HTE foil or standard electrodeposited copper foil is employed as the carrier foil instead of S-HTE foil. Since S-HTE foil is recrystallized at approximately 180° C., the S-HTE foil easily follows the thermal expansion behavior of the electrodeposited copper foil layer during heating as compared with HTE foil. Thus, peeling at the organic adhesive interface layer is considered to be suppressed. Briefly, the greater the difference in coefficient of thermal expansion, the more easily peeling occurs due to thermal expansion.

The above-shown data are typical data among the data which the present inventors have obtained in their research. Thus, electrodeposited copper foils with carrier which are formed of the materials satisfying the above conditions can exhibit a peel strength of 3 gf/cm to 100 gf/cm; i.e., the target peel strength of the present invention, after hot-pressing for producing copper-clad laminates is completed. In addition, the present inventors have carried out further experiments, and have found that when the average difference between the coefficient of thermal expansion of the electrodeposited copper foil layer at a certain temperature and that of the carrier foil layer at the same temperature in the temperature-elevating step is $0.04 \times 10^{-5}$/deg.C or more, the target peel strength of the carrier foil can be attained.

Thus, when electrodeposited copper foil belonging to any one of Grades 1 to 3 is employed as the carrier foil and V-type foil is employed as the electrodeposited copper, the average difference between the coefficient of thermal expansion of the electrodeposited copper foil layer at a certain temperature and that of the carrier foil layer at the same temperature becomes $0.04 \times 10^{-5}$/deg.C or more. As a result, the carrier foil can be peeled at a peel strength of 3 gf/cm to 100 gf/cm after hot-pressing for producing copper-clad laminates is completed.

In the present invention, at least one species selected from nitrogen-containing organic compounds, sulfur-containing organic compounds, and carboxylic acids is preferably employed as the organic agent. The specific organic agents described below are suitably used in the present invention. At present, it is confirmed that these compounds are not detrimental to production of printed wiring boards from produced copper-clad laminates including steps such as resist-application steps, etching steps, plating steps, and mounting steps.

Among these compounds, the nitrogen-containing organic compounds may have a substituent. Specifically, substituted triazloes are preferably used. Examples include 1,2,3-benzotriazole (hereinafter referred to as BTA), carboxybenzotriazole (hereinafter referred to as CBTA), N', N'-bis (benzotriazolylmethyl) urea (hereinafter referred to as BTD-U), 1H-1,2,4-triazole (hereinafter referred to as TA), and 3-amino-1H-1,2,4-triazole (hereinafter referred to as ATA).

Examples of preferably employed sulfur-containing compounds include mercaptobenzothiazole (hereinafter referred to as MBT), thiocyanuric acid (hereinafter referred to as TCA), and 2-benzimidazolethiol (hereinafter referred to as BIT).

Monocarboxylic acids are particularly preferably used as the carboxylic acids. Examples include oleic acid, linoleic acid, and linolenic acid.

Throughout the description, the term "electrodeposited copper foil (electrodeposited copper foil layer)" refers to an electrodeposited copper foil coated with copper microparticles for anchoring and an anti-corrosion layer as shown in the cross-sectional view of FIG. 2. The copper microparticles form a surface-treated layer which ensures stable adhesion between an insulating substrate and a bulk copper layer for maintaining electrical conductivity of the produced printed wiring boards. However, in the present description, detailed description of the surface-treated layer is omitted in the parts other than "Modes for Carrying Out the Invention."

The aforementioned electrodeposited copper foil with carrier is produced by a method including forming an organic adhesive interface layer on a carrier foil by use of an organic agent and electrodepositing copper serving as an electrodeposited copper foil layer.

In the invention, there is provided a copper-clad laminate which is produced from an electrodeposited copper foil with carrier. The carrier foil of the copper-clad laminate can be peeled readily and smoothly by considerably low peeling force, thereby further enhancing operational efficiency. In addition, the carrier foil can be peeled stably at 3 gf/cm to 100 gf/cm, thereby attaining automated peeling operation by means of a peeling machine.

MODES FOR CARRYING OUT THE INVENTION

Figure 1:
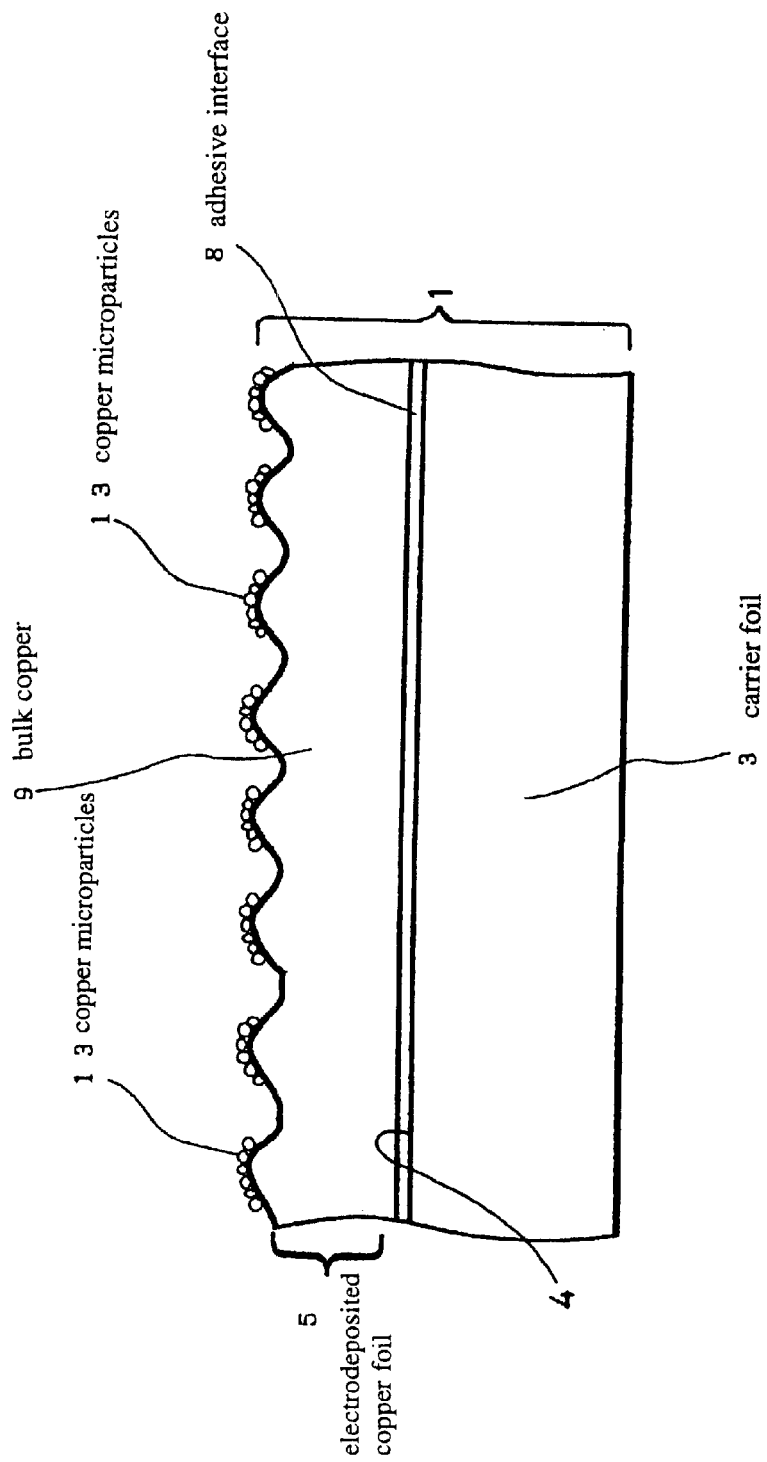
FIG. 1 is a schematic cross-sectional view of an electrodeposited copper foil with carrier according to the present invention.

Embodiments for carrying out the present invention will next be described. In the following embodiments, methods for producing the electrodeposited copper foil with carrier of the present invention and copper-clad laminates produced from the electrodeposited copper foil with carrier are described, along with results of evaluation of the foils. The carrier foil described in the following embodiments is formed of an electrodeposited copper foil. In the Figures, when possible, identical portions are denoted by the same reference numerals. The embodiments will be described with reference to FIGS. 1 and 2.

EMBODIMENT 1

Figure 2:
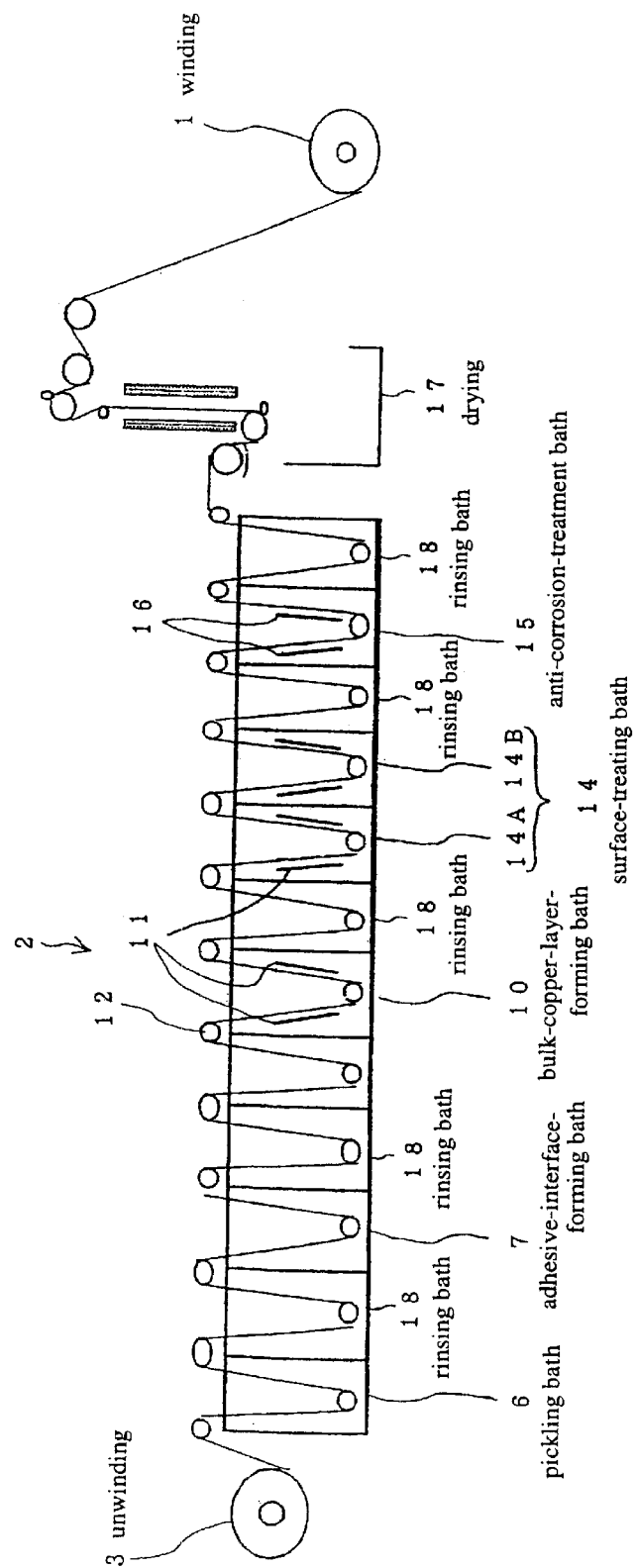
FIG. 2 is a schematic cross-sectional view of an apparatus used for producing an electrodeposited copper foil with carrier according to the present invention.

In Embodiment 1, an electrodeposited copper foil with carrier 1 shown in FIG. 1 is described. An apparatus 2 for producing an electrodeposited copper foil with carrier 1 is shown in FIG. 2. In the apparatus, a carrier foil 3 is unwound from a foil roll and travels, in a winding manner, along the process line. An HTE foil which has a thickness of 18 μm, is classified as Grade 3, and had not been subjected to any surface treatment was employed as the carrier foil 3, and the electrodeposited copper foil layer 5 having a thickness of 3 μm was formed on a shiny side 4 of the carrier foil. Hereinafter, production conditions of electrodeposited copper foils with carrier will be described with reference to an apparatus wherein a variety of baths are continuously disposed in-line.

Firstly, the carrier foil 3 taken from the foil roll was transferred into a pickling bath 6 filled with a diluted sulfuric acid solution having a concentration of 150 g/l at 30° C. The carrier foil was immersed for 30 seconds, to remove oily matter and surface oxide film from the surface of the carrier foil 3.

After the carrier foil 3 had been treated in the pickling bath 6, the foil was transferred into an adhesive-interface-forming bath 7 filled with a 5 g/l aqueous solution of CBTA (pH 5) at 40° C. The carrier foil 3 was run into the bath and immersed for 30 seconds, forming a CBTA adhesive interface layer 8 on a surface of the carrier foil 3.

After the adhesive interface layer 8 had been formed, a bulk copper layer 9 was formed from an electrolyte for electrodeposited copper foil of V-type on the adhesive interface layer. A bulk-copper-layer-forming bath 10 was filled with a copper sulfate solution having a sulfuric acid concentration of 70 g/l and a copper concentration of 63.5 g/l ($CuSO_4 \cdot 5H_2O$) at 40° C. While the carrier foil 3 having an adhesive interface layer 8 passes through the bath, the bulk copper layer 9 is electrodeposited. In order to deposit copper uniformly and smoothly on the adhesive interface layer, as shown in FIG. 2, anode plates 11 were placed such that the anode plates faced in parallel with one surface of the carrier foil 3. Electrolysis was carried out for 150 seconds under level plating conditions and at a current density of 5 $A/dm^2$. In this case, at least one tension roll 12 maintaining contact with the running carrier foil 3 served as a current-supplier so as to polarize the carrier foil 3 per se to a cathode.

After formation of the bulk copper layer 9 was completed, the carrier foil 3 was transferred into a copper-microparticle-forming bath 14 in order to form copper microparticles 13 on the surface of the bulk copper layer 9. The treatment carried out in the copper-microparticle-forming bath 14 involves depositing copper microparticles 13 on the bulk copper layer 9 (step 14A) and seal-plating so as to prevent release of the copper microparticles 13 (step 14B).

Step 14A, depositing copper microparticles 13 on the bulk copper layer 9, employed a copper sulfate solution (sulfuric acid concentration of 100 g/l, copper concentration of 18 g/l, temperature of 25° C.) similar to that employed in the bulk-copper-layer-forming bath 10, and electrolysis was carried out for 10 seconds under conditions for forming burnt deposit at a current density of 10 $A/dm^2$. In this case, as shown in FIG. 2, anode plates 11 were placed such that the anodes plates faced the bulk-copper-layer (9)-deposited surface of the carrier foil 3 in parallel.

Step 14B, seal-plating so as to prevent release of the copper microparticles 13, employed a copper sulfate solution (sulfuric acid concentration of 150 g/l, copper concentration of 65 g/l, temperature 45° C.) similar to that employed in the bulk-copper-layer-forming bath 10, and electrolysis was carried out for 20 seconds under seal plating conditions and at a current density of 15 $A/dm^2$. In this case, as shown in FIG. 2, anode plates 11 were placed such that the anodes plates faced the copper-microparticles (13)-deposited surface of the carrier foil 3 in parallel.

Anti-corrosion treatment was carried out in an anti-corrosion-treatment bath 15, by use of zinc as a corrosion-inhibiting element. The concentration of zinc in the anti-corrosion-treatment bath 15 was maintained by employment of zinc plates serving as soluble anodes 16. The electrolysis was carried out in a solution comprising zinc (20 g/l) and sulfuric acid (70 g/l), at a temperature of 40° C. and a current density of 15 $A/dm^2$.

After completion of the anti-corrosion treatment, the carrier foil 3 was passed through, over 40 seconds, a drying portion 17 where the atmosphere had been heated to 110° C., to thereby produce an electrodeposited copper foil with carrier 1, which was then wound into a roll. During the aforementioned steps, the carrier foil ran at 2.0 m/minute. The foil was then washed with water in a rinsing bath 18 capable of performing about 15 sec. rinsing and disposed between successive operation baths, thereby preventing the solution from being carried over from the previous bath.

The thus-formed electrodeposited copper with carrier 1 and two sheets of FR-4 prepreg having a thickness of 150 μm were laminated to thereby produce a double-sided copper-clad laminate. The peel strength at the organic adhesive interface 8 between the carrier foil layer 3 and the electrodeposited copper foil layer 5 was measured. The results show that the adhesive interface layer 8 has an average thickness of 10 nm and that the difference between the coefficient of thermal expansion of the carrier foil layer 3 and that of the electrodeposited copper foil 5 is $0.286 \times 10^{-5}$/deg.C. The measured peel strength was 4.0 gf/cm (before heating) and 4.2 gf/cm (after one hour's heating at 180° C.).

EMBODIMENT 2

In Embodiment 2, an electrodeposited copper foil with carrier 1 shown in FIG. 1 is described. An apparatus 2 for producing an electrodeposited copper foil with carrier 1 is shown in FIG. 2. In the apparatus, a carrier foil 3 is unwound from a foil roll and travels, in a winding manner, along the process line. An S-HTE foil which has a thickness of 18 μm, is classified as Grade 3, and had not been subjected to any surface treatment was employed as a drum foil; i.e., the carrier foil 3, and the electrodeposited copper foil layer 5 having a thickness of 3 μm was formed on a shiny surface 4 of the drum foil.

In Embodiment 2, the procedure of Embodiment 1 was carried out, except that a different type of carrier foil was employed. Thus, repeated description is omitted.

The formed electrodeposited copper with carrier 1 and two sheets of FR-4 prepreg having a thickness of 150 μm were laminated to thereby produce a double-sided copper-clad laminate. The peel strength at the organic adhesive interface 8 between the carrier foil layer 3 and the electrodeposited copper foil layer 5 was measured. The results show that the adhesive interface layer 8 has an average thickness of 10 nm and that the difference between the coefficient of thermal expansion of the carrier foil layer 3 and that of the electrodeposited copper foil 5 is $0.046 \times 10^{-5}$/deg.C. The measured peel strength was 70.4 gf/cm (before heating) and 70.8 gf/cm (after one hour's heating at 180° C.).

EMBODIMENT 3

In Embodiment 3, an electrodeposited copper foil with carrier 1 shown in FIG. 1 is described. An apparatus 2 for producing an electrodeposited copper foil with carrier 1 is shown in FIG. 2. In the apparatus, a carrier foil 3 is unwound from a foil roll and travels, in a winding manner, along the process line. A standard copper foil which has a thickness of 18 μm, is classified as Grade 1, and had not been subjected to any surface treatment was employed as a drum foil; i.e., the carrier foil 3, and the electrodeposited copper foil layer 5 having a thickness of 3 μm was formed on a shiny surface 4 of the drum foil.

In Embodiment 3, the procedure of Embodiment 1 was carried out, except that a different type of carrier foil was employed. Thus, repeated description is omitted.

The formed electrodeposited copper with carrier 1 and two sheets of FR-4 prepreg having a thickness of 150 μm were laminated to thereby produce a double-sided copper-clad laminate. The peel strength at the organic adhesive interface 8 between the carrier foil layer 3 and the electrodeposited copper foil layer 5 was measured. The results show that the adhesive interface layer 8 has an average thickness of 10 nm and that the difference between the coefficient of thermal expansion of the carrier foil layer 3 and that of the electrodeposited copper foil 5 is $0.225 \times 10^{-5}$/deg.C. The measured peel strength was 5.8 gf/cm (before heating) and 6.5 gf/cm (after one hour's heating at 180° C.).

Effects of the Invention

In the electrodeposited copper foil with carrier of the present invention, peeling at the interface between the carrier foil layer and the electrodeposited copper foil layer can be readily performed at force in the range of 3 gf/cm to 100 gf/cm. Thus, there can be attained stable peelability of the carrier foil that conventional electrodeposited copper foils with peelable carrier have never provided. Such characteristics enable the carrier foil to be peeled automatically, and production yield of copper-clad laminates can be greatly improved.

What is claimed is:

1. An electrodeposited copper foil with carrier comprising a carrier foil layer, an organic adhesive interface layer formed on the carrier foil layer, and an electrodeposited copper foil layer formed on the organic adhesive interface layer, wherein the material that forms the carrier foil layer is an electrodeposited copper foil classified as Grades 1 to 3 of the IPC standards, and the material that forms the electrodeposited copper foil layer is classified as very low profile type (V type) of the IPC standards, wherein the difference between the coefficient of thermal expansion of material forming the carrier foil layer at a certain temperature and that of material forming the electrodeposited copper foil at the same temperature is $4 \times 10^{-7}$/° C. or more.

2. A copper-clad laminate which is produced from an electrodeposited copper foil with carrier as recited in claim 1.

* * * * *